United States Patent [19]

Frew et al.

[11] Patent Number: 4,803,632

[45] Date of Patent: Feb. 7, 1989

[54] INTELLIGENT UTILITY METER SYSTEM

[75] Inventors: Larry H. Frew, Simi Valley; Melvin L. Fuller, Ventura, both of Calif.

[73] Assignee: Utility Systems Corporation, Tarzana, Calif.

[21] Appl. No.: 861,560

[22] Filed: May 9, 1986

[51] Int. Cl.$^4$ .................... G01R 21/133; G06F 15/20
[52] U.S. Cl. .......................... 364/464.04; 340/310 A; 340/870.02; 364/483
[58] Field of Search ............ 324/74, 142; 340/310 A, 340/538, 870.02, 870.03, 870.05, 870.29; 364/483, 464

[56] References Cited

U.S. PATENT DOCUMENTS

| Re. 31,774 | 12/1984 | Fletcher et al. | 364/483 |
|---|---|---|---|
| 3,676,875 | 7/1972 | Adams et al. | 340/870.03 |
| 3,974,694 | 8/1976 | Eberie et al. | 235/1 C X |
| 4,077,061 | 2/1978 | Johnston et al. | 364/492 X |
| 4,213,119 | 7/1980 | Ward et al. | 340/870.29 X |
| 4,218,737 | 8/1980 | Buscher et al. | 340/870.03 |
| 4,240,030 | 12/1980 | Bateman et al. | 324/110 |
| 4,291,375 | 9/1981 | Wolf | 364/464 X |
| 4,345,311 | 8/1982 | Fielden | 364/464 X |
| 4,351,028 | 9/1982 | Peddie et al. | 364/483 |
| 4,399,510 | 8/1983 | Hicks | 364/464 |
| 4,428,022 | 1/1984 | Engel et al. | 364/483 X |
| 4,442,492 | 4/1984 | Karlsson et al. | 340/870.05 X |
| 4,542,469 | 9/1985 | Brandyberry et al. | 364/483 |
| 4,568,934 | 2/1986 | Allgood | 340/870.05 X |
| 4,630,211 | 12/1986 | Pettis | 364/464 |
| 4,689,752 | 8/1987 | Fernandes et al. | 364/483 X |

Primary Examiner—Parshotam S. Lall
Assistant Examiner—Edward B. Cosimono
Attorney, Agent, or Firm—Poms, Smith, Lande & Rose

[57] ABSTRACT

A data processor type utility meter for electricity, and/or water, gas and therms, is provided with a display which successively displays any or all of the following: (1) the meter serial number, (2) cumulative kilowatt hours, (3) present kilowatts being used, (4) current cost or remaining credit in dollars for utility servies used, (5) "Time of Use" hours and rates, (6) power phase angle, (7) maximum power drawn (or "Demand") during predetermined intervals, (8) clock and calendar, (9) water usage/cost, (10) gas usage/cost, (11) load profiles, (12) a power diversion detection indication, and (13) power co-generation data. The system includes a basic meter unit having a 16 digit alphanumeric display, a CPU, and associated solid state circuitry, which may be mounted on the outside of a house or building in the conventional meter location. Alternatively, the meter unit may be pole mounted or buried. Power line carrier is provided to communicate with external equipment, including a remote display unit inside the user's home or other building to permit convenient viewing of the displayed information. A meter reader/programmer can access and retrieve or modify information in the basic meter unit using power line carrier or optical (infrared) coupling; and credit card payment arrangements are included in the card reader of the remote inside display unit. The voltage and current is sampled 1024 times per second or about 16.67 times during each power cycle to provide an accurate indication of power drawn. Inputs from other utilities are supplied from suitable sensors or computed from sample rate data. Special analog-to-digital circuit control and sensing arrangements provide full utilization of the digital circuitry and lead to an economical complete system.

12 Claims, 8 Drawing Sheets

REMOTE DISPLAY UNIT

METER PROGRAMMER READER

REMOTE DISPLAY UNIT

METER PROGRAMMER READER

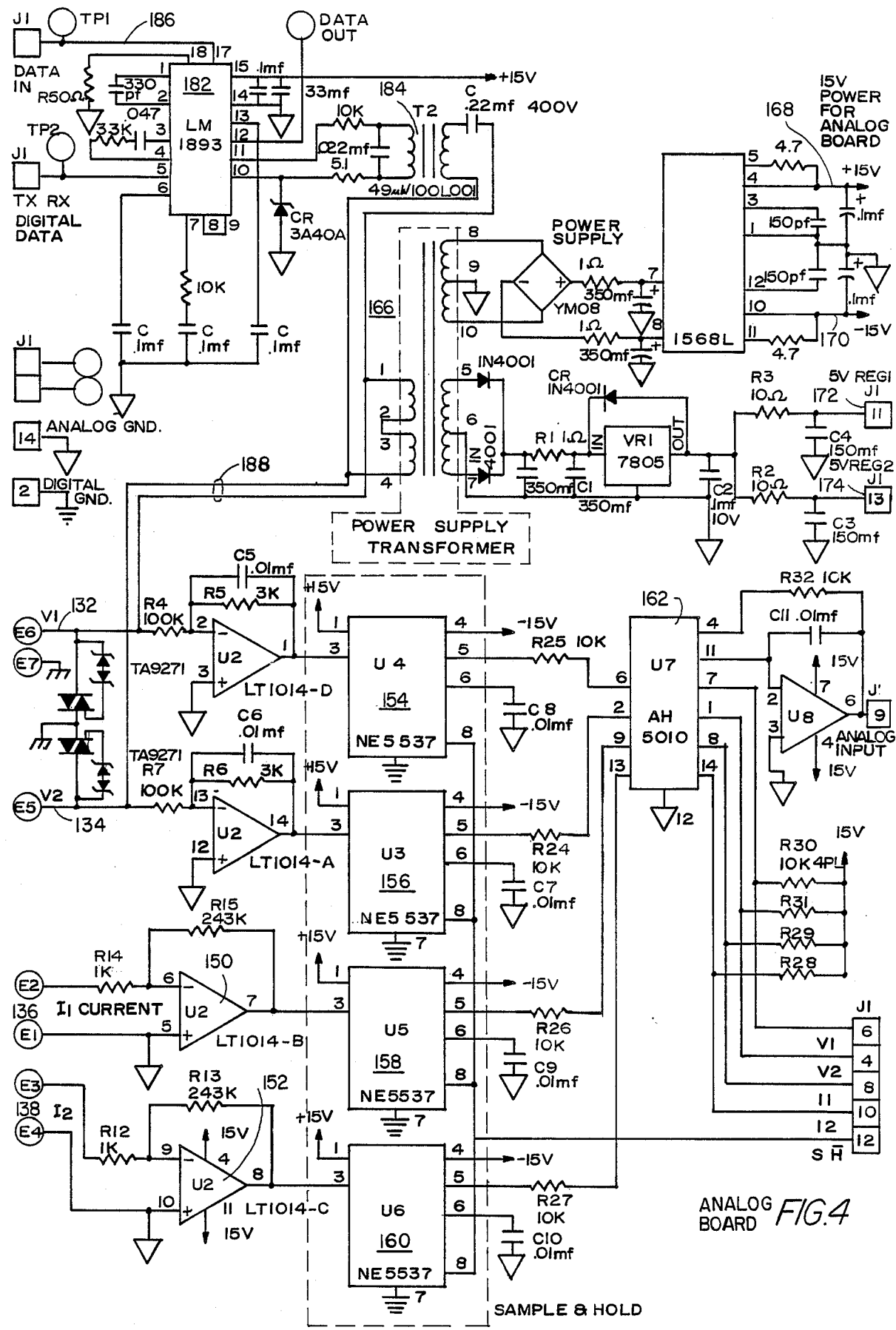
ANALOG BOARD FIG.4

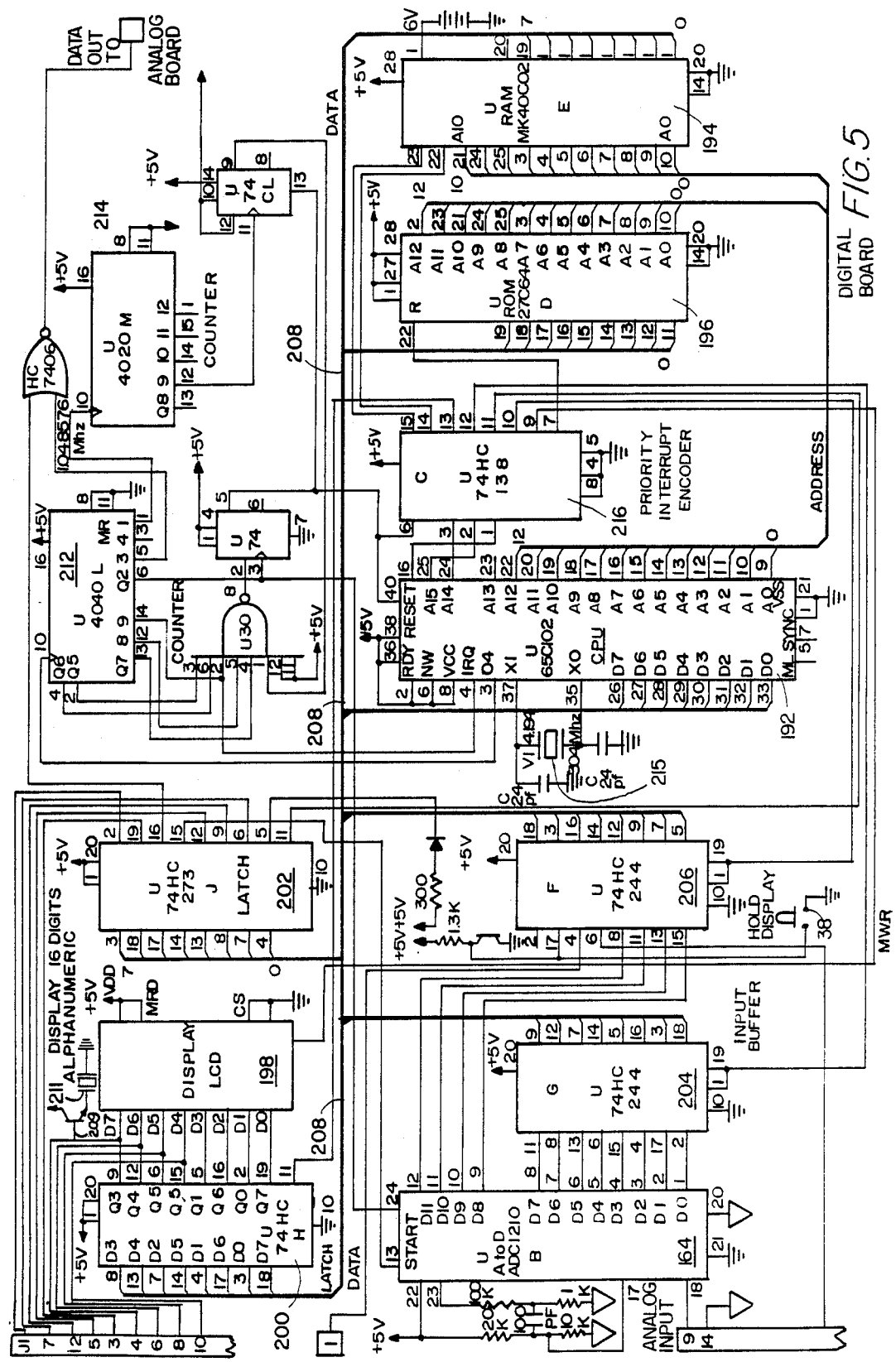

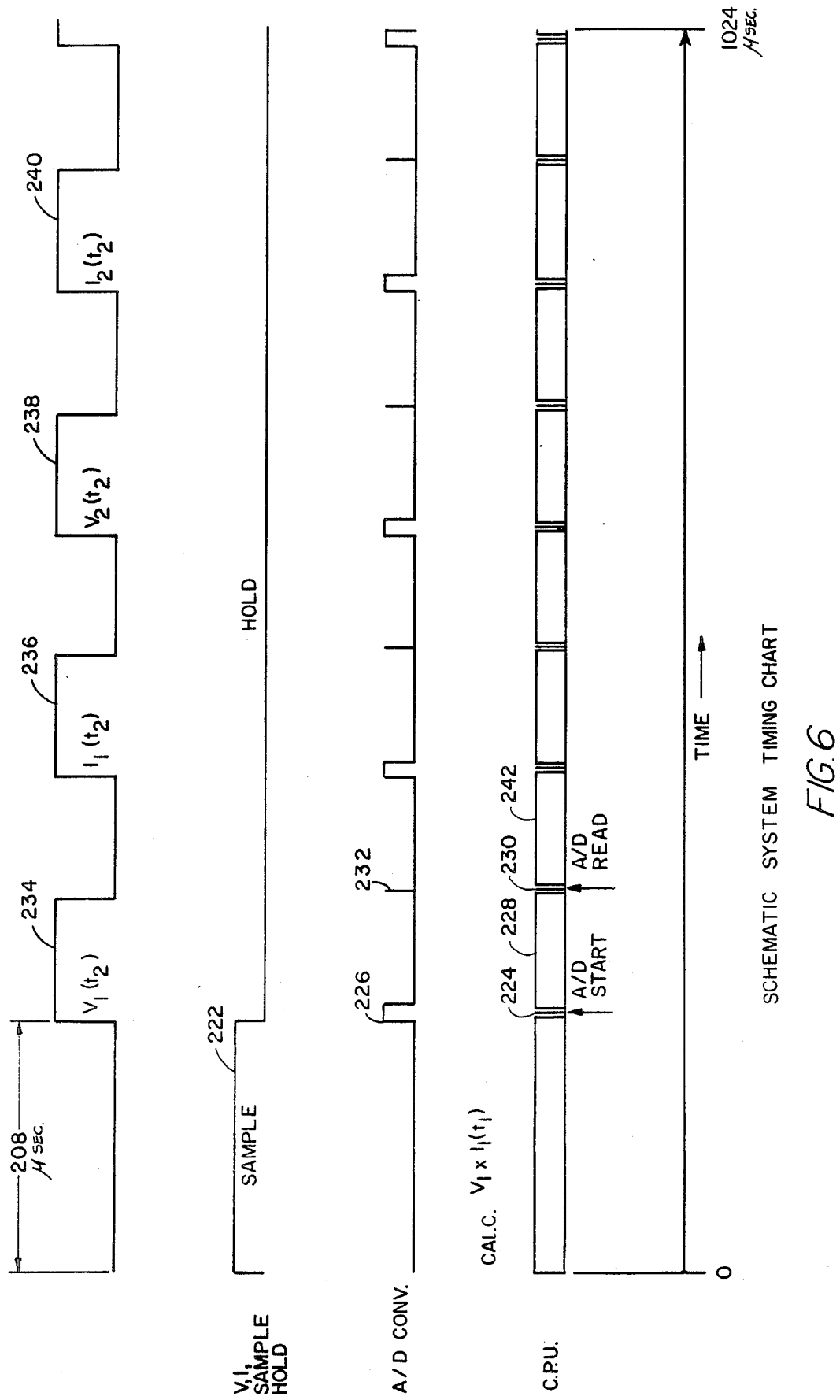
FIG.6 SCHEMATIC SYSTEM TIMING CHART

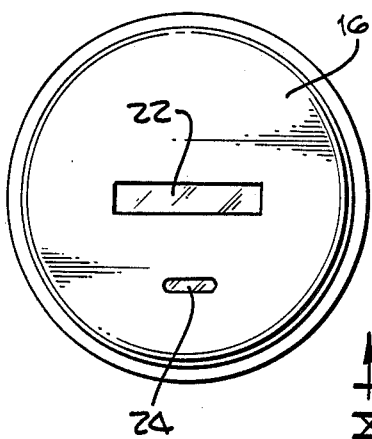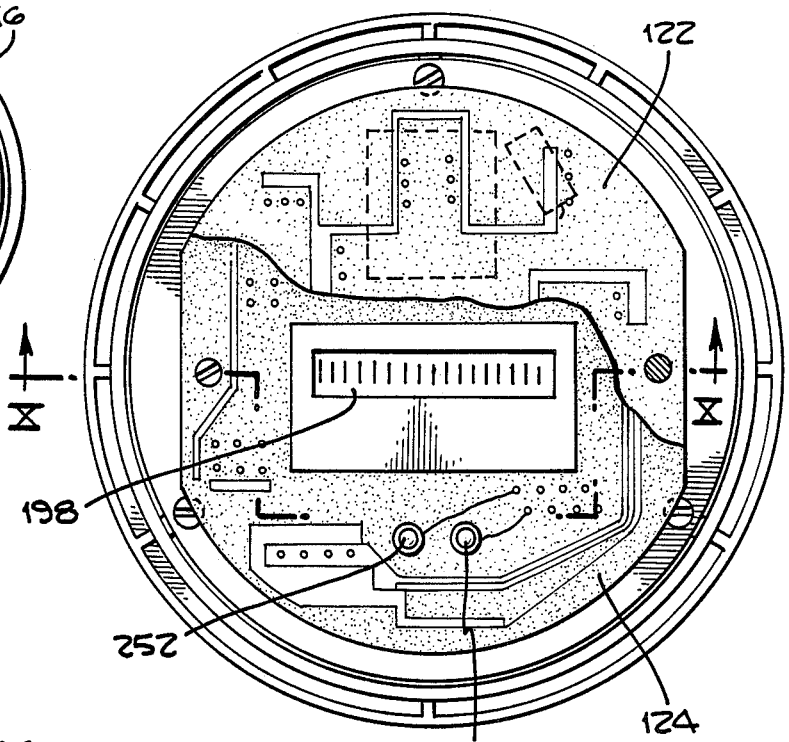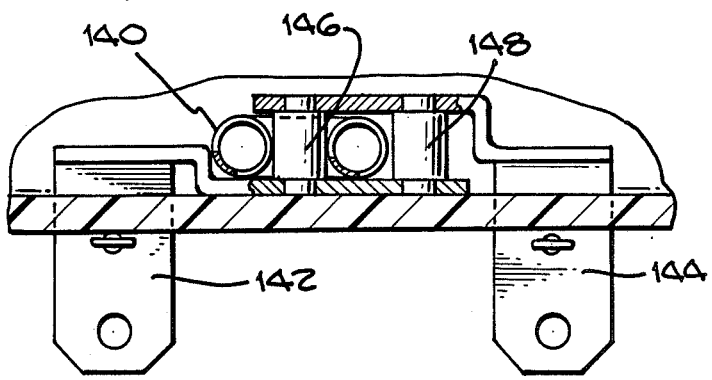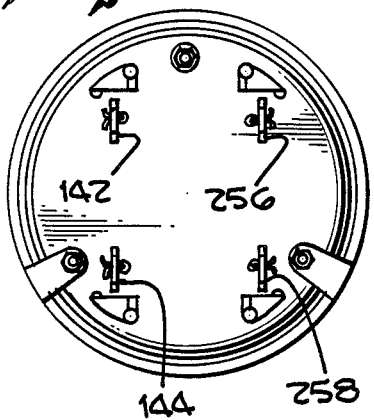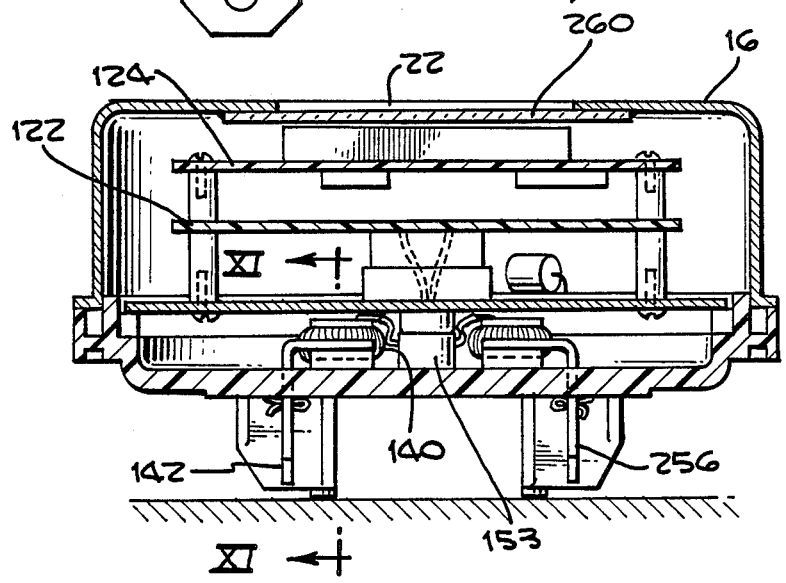

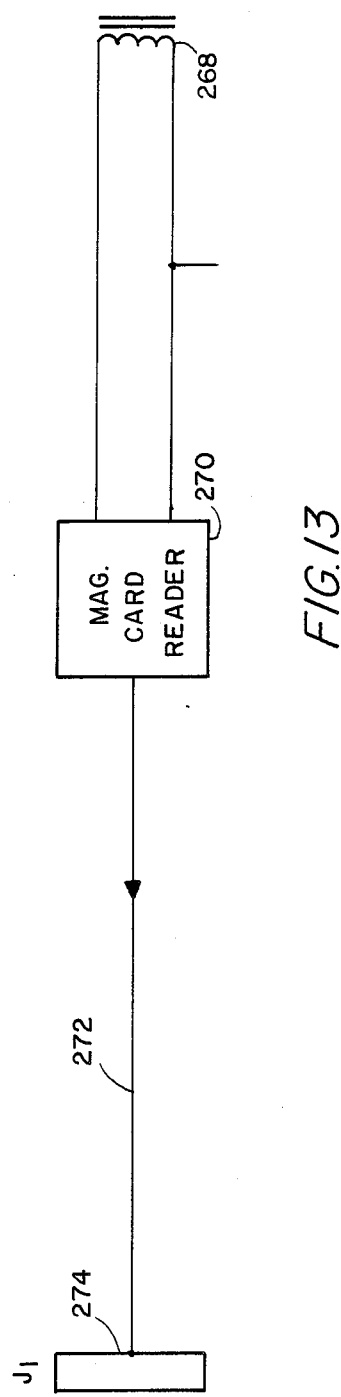
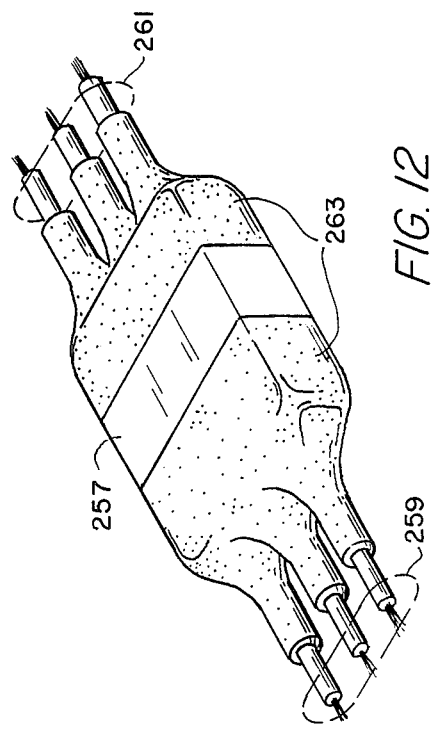

4,803,632

INTELLIGENT UTILITY METER SYSTEM

FIELD OF THE INVENTION

This invention relates to "intelligent" utility metering systems.

BACKGROUND OF THE INVENTION

Various proposals have been made heretofore to increase the capabilities of utility meters, and to permit payment by credit card. However, all such proposals have either been severely limited in their capabilities or have been unreasonably complex and expensive.

Accordingly, the principal object of the present invention is to provide a versatile and economical utility meter system having all of the functions and providing all of the information of interest to customers and to the utility company, in a practical and economical configuration and one which is compatible with existing facilities.

SUMMARY OF THE INVENTION

In accordance with the present invention, a basic utility meter, for example an electric utility meter, is provided which may be mounted in place of existing meters, which samples current and voltage many times each cycle and accurately calculates real power usage; and also includes a scrolling or cyclic display which selectively includes a plurality of the following displays:
 (1) the meter serial number;
 (2) cumulative kilowatt hours;
 (3) present kilowatts being used;
 (4) current cost or remaining credit in dollars for utility services used;
 (5) "Time of Use" hours and rates;
 (6) power phase angle;
 (7) maximum power drawn (or "Demand") during predetermined intervals;
 (8) clock and calendar;
 (9) water usage/cost;
 (10) gas usage/cost;
 (11) load profiles;
 (12) a power diversion detection indication; and
 (13) power co-generation data.

The system may also typically include one or more the following equipments or features, which are described in some detail for an electrical meter system, but which would generally apply to gas, water and therms:

(1) A Remote Display Unit (RDU) may be mounted within the customer's home or premises, and may be coupled to the main meter unit in any desired manner, for example, by a power line signaling system. As the display cycles through the scheduled information, the customer may actuate a "hold" switch to retain the desired information on the display for further perusal.

(2) The Remote Display Unit (RDU) may also include a credit card reading facility so that utility charges may be pre-paid or post-paid by credit card.

(3) A meter programmer/reader (MPR) unit may be carried by a meter reader, and the information stored in the meter may be accessed by and/or modified by the meter reader either (a) via an optical probe or (b) through an electrical outlet at the facility permitting inter-unit coupling by power line carrier code.

(4) An optical meter probe (MP) unit is a separate, light weight, self-contained unit which includes random access memory, and can store more information than can be collected by a meter reader in one day's rounds.

(5) The current may be sensed by one or more transformers, encircling either (1) the incoming power line or power bus or (2) one of two or more parallel branches of each incoming power line or power bus, or the current may be sensed by a shunt primarily applicable to D.C. systems, or by a solid state current measuring device.

(6) As a collateral feature, the unit may be placed in a test mode, wherein a special symbol such as an asterisk is moved across the extended multiple digit alphanumeric display at a predetermined proportionality rate corresponding to power being used, comparable to present day meter checking arrangements in which the dot on the rotating induction disk may be viewed and timed in its rotation by the meter tester.

(7) Standardized circuit boards may be employed in the basic meter unit, with selected circuitry in the remote display unit (RDU) and the meter programmer/reader (MPR) being identical to that in the basic meter unit.

(8) Relatively low cost, reliable digital components may be employed at full utilization by the use of special analog-to-digital conversion control and reading arrangements, whereby the central processing unit (CPU) is not idle while the A/D converter is performing its local active calculation; instead, the CPU is proceeding with its power and other calculation algorithms and/or its other control functions, using voltage and current data from the previous sampling interval. Using this arrangement, a low cost but reliable eight bit CPU may be employed, and power calculated using 12 bit accuracy digitized values of current and voltage, $16\frac{2}{3}$ times per power cycle, or about 1024 times per second; and the relatively complex display functions may also be handled. Gas, water, and therms do not require complex or such frequent calculations.

(9) The meter cover may be formed of nickel-plated steel, to provide electrical shielding, and the reflective outer surface reduces the ambient temperature excursions.

A collateral feature of the invention involves the ease of installation of both the "outside" main unit of the intelligent utility meter and the remote "inside" display and credit card responsive unit. More specifically, in one embodiment, the main unit is provided with a mating base which fits the standard utility meter socket; and the remote "inside" unit only has to be plugged into a wall socket, with communication between the two units being accomplished over the power lines. Accordingly, no special mechanical or electrical installation arrangements are required, thus minimizing change-over expenses, and permitting easy trial installations. Incidentally, as noted above, the basic meter unit may also be mounted on the utility poles, or underground.

The new meter also permits more accurate measurement of power in that pulses of power drawn from the system are accurately measured; and the theft technique of reversing the meter and running it backward will no longer work, as the absolute value of the power is calculated.

Other objects, features, and advantages of the invention will become apparent from a consideration of the following detailed description and from the accompanying drawings.

BRIEF DESCRIPTION OF THE DRAWINGS

FIG. 4 is a logic circuit diagram of the analog board included in the meter unit per se;

FIG. 5 is a schematic block diagram of the digital circuit board which is included in the meter unit;

FIG. 6 is a schematic system timing chart for the intelligent utility meter system;

FIG. 7 is a plan view showing the outside of the basic meter unit per se;

FIG. 8 is a view of the meter unit of FIG. 7 from the bottom thereof; FIG. 9 shows the meter with the top removed, and the upper circuit board partially cut away;

FIG. 10 is a cross-sectional view taken along lines X—X of FIG. 9;

FIG. 11 is an enlarged view showing one pair of input electrical terminals to the utility meter unit, together with a transformer coil employed to measure the current flowing through the indicated electrical terminals;

FIG. 12 is a perspective view of an embodiment of the meter which may be pole-mounted, or located underground, showing the wire feed and shrink sealed electrical connections;

FIG. 13 is a schematic showing of the credit card reader circuit included in the remote display unit;

DETAILED DESCRIPTION

Figure 1:
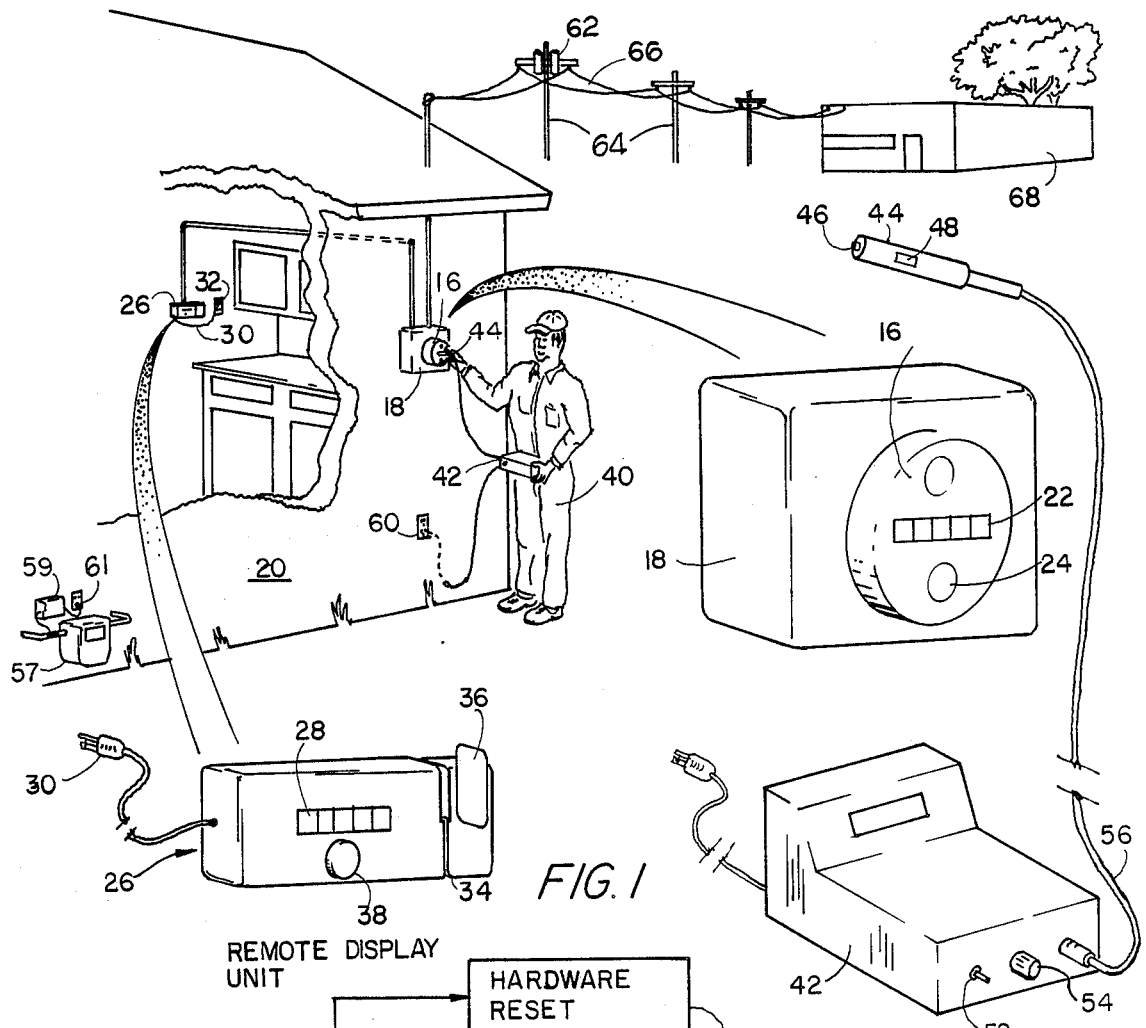
FIG. 1 is an overall schematic view of an intelligent utility meter system illustrating the principles of the present invention.

Referring more particularly to the drawings, FIG. 1 is a schematic view of the complete intelligent utility meter system, with some of the units being shown in enlarged form. More particularly, the meter unit 16 is shown mounted on the usual base 18 provided on the side of the home or other building 20 to which electrical power is being supplied. Visible from the exterior of the meter 16 is a 16 digit, dot matrix, liquid crystal, alphanumeric display 22, and an optical input/output port 24.

Within the building 20 may be mounted the remote display unit (RDU) 26 which includes an LDC alphanumeric display 28 equivalent to the display 22 which is a part of the meter unit per se. The remote display unit 26 includes a standard three prong electrical plug 30 which may be plugged into any outlet 32 within the building 20. The communication between the principal meter unit 16 and the remote display unit 26 is by frequency shift power line carrier, as will be discussed in greater detail hereinbelow. Accordingly, no special electrical installation is required for the remote display unit 26; instead, it may be mounted in any convenient location within the building 20, and merely plugged into a convenient wall socket.

Concerning additional features of the remote display unit 26, it includes a credit card receptable slot 34 through which a credit card 36 may be slid, and read. As the credit card 36 is read by the RDU 26, an appropriate charge may be made against the credit card, and the prior bill which is outstanding to the electrical utility company may be paid; or, alternatively, the credit card may provide a prepayment of a certain amount, in cases where the financial arrangements between the electrical utility company and the particular customer are such that prepayment is required.

As mentioned above, the displays 28 and 22 on the remote display unit and on the meter, respectively, successively display the information enumerated in the abstract and the introduction of the present patent specification. When a particular display appears on the remote display unit 26, and when the customer wishes to retain this information for further consideration or copying, the switch 38 may be actuated; and following such actuation, the particular display shown on the LCD display 28 will be retained, until the switch 38 is actuated and the display is returned to its normal state where successive items of information are displayed at 2 second intervals.

Also shown in FIG. 1 is the meter reader 40. He has in his left hand a meter programmer reader unit 42, and in his right hand a optical meter probe 44. The optical probe 44 and the meter programmer reader 42 may be employed either together or separately. The meter 16 is provided with a window or port 24 in a recess into which the nose 46 of the optical probe 44 may be applied. Following application of the nose 46 of the probe 44 into the recess associated with window or port 24, the optical probe 44 is turned on by the actuation of switch 48, and in response to a coded signal being applied through the window 24, the meter unit 16 responds by providing a coded light output signal to the optical probe of 44 which is picked up and stored within the memory of the optical probe unit 44 along with the customer's identification number. At the end of the day, after the meter reader has obtained data from a number of customers, the optical probe is returned to the electric utility company offices, and the customer billing information is transferred from the optical probe random access memory to the billing computer of the utility system.

The meter programmer reader 42 is somewhat more elaborate, and is provided with a capability so that it may change the data stored within the meter 16. Thus, by way of example but not of limitation, the meter programmer/reader may change the rate structure and introduce additional variations into the "time of use" rates. In addition, when desired, the meter programmer/reader may reset the cumulative power reading for the customer to the desired setting (which function may also be done by the optical meter probe). Also, following payment by the customer, the amount owing or the amount credited to the customer's account may be altered and the subsequent displays changed to conform to the new information. As discussed hereinbelow, the meter programmer/reader 42 may be preprogrammed at the electrical utility offices to make the desired changes in the information stored in the meter 16; and these changes may be associated with individual customer numbers, as in the case of billing payments, or may be general rate and time of use time changes, applicable to all customers. One of the switches 52 on the front of the meter programmer 42 is the on-off switch and the second of switch 54 implements the transmission of desired programming changes from the meter programmer/reader 42 to the meter 16.

The meter programmer/reader 42 may be coupled to the meter 16 in either of two ways. In accordance with one alternative, it may be coupled to the optical port 24 by the optical probe 44, with output signals being transferred to the meter programmer/reader over the cable 56. Alternatively, the meter programmer/reader may be plugged in to any facility electrical outlet, such as the outlet 60 shown on the exterior of the building 20. When it is plugged in to the power system, the optical probe 44 and its associated cable 56 may be dispensed with, and the meter/programmer reader may be coupled to the meter 16 through the electrical outlet 60 by frequency shift keying, over the power lines, as discussed hereinbelow.

In FIG. 1 of the drawings, a step-down transformer 62 is shown mounted on one of the utility poles 64 by which the power lines 66 are connected to a remote electrical utility building 68. An electrical utility employee using a meter programmer reader 42, may plug into the power lines at any point toward the customers from the transformer 62 and couple directly to the meter 16 of any desired facility. This is accomplished using the unique code which identifies each customer, and then transmitting the desired reprogramming information. Accordingly, large numbers of customers such as a few hundred, may all have their utility rates changed from a single meter programmer/reader location coupled to the power system on the customer side of the transformer 62.

In the foregoing description of FIG. 1, the general nature of the present intelligent utility meter system has been discussed. In the course of the description of the remaining figures of the drawings, the detailed operation of the system will be developed in greater detail.

Figure 2:
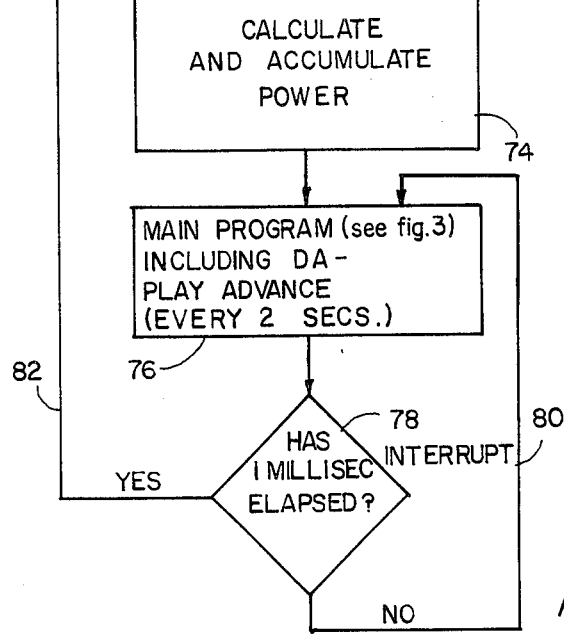
FIG. 2 is a block diagram indicating the overall sequence of operations of the system of FIG. 1.

Initially, FIG. 2 is a generalized block diagram of the mode of operation of the present system. More specifically, with reference to FIG. 2, the initial block 72 indicating "hardware reset" represents the initiation of the system as the system is placed into service. The meter unit 16 includes a CPU, which has as one of its principal functions, the calculation of power supplied to the facility 20 as shown in FIG. 1, through the meter unit 16. This function is indicated by the block 74 in FIG. 2, and this function takes up approximately one-half of the time of the CPU and associated logic circuitry. It might be noted in this regard that the voltage and the current, which are supplied through each of two circuits coupled to the meter unit 16, is sensed about 16.667 times during each cycle, or approximately 1024 times during each second, for a 60 cycle power system. Using an 8-bit calculator, and with a digital representation of the voltage and current to 12 binary digits or bits of digital accuracy, the calculation of the power takes up about one-half of the operating time and capacity of the CPU. The remaining functions accomplished by the CPU, including displaying the various quantities as mentioned hereinabove, are indicated by block 76 in FIG. 2. The diamond 78 in FIG. 2 indicates the "interrupt" which happens approximately every millisecond, and which recycles the CPU to proceed with the next calculation of power. As indicated by the line 82, successive steps in the main program are continued, if there has been no interruption, as indicated by the diamond 78; and the line 80 indicates a return to the power calculation as indicated by the block 74 if one millisecond has elapsed.

Figure 3:
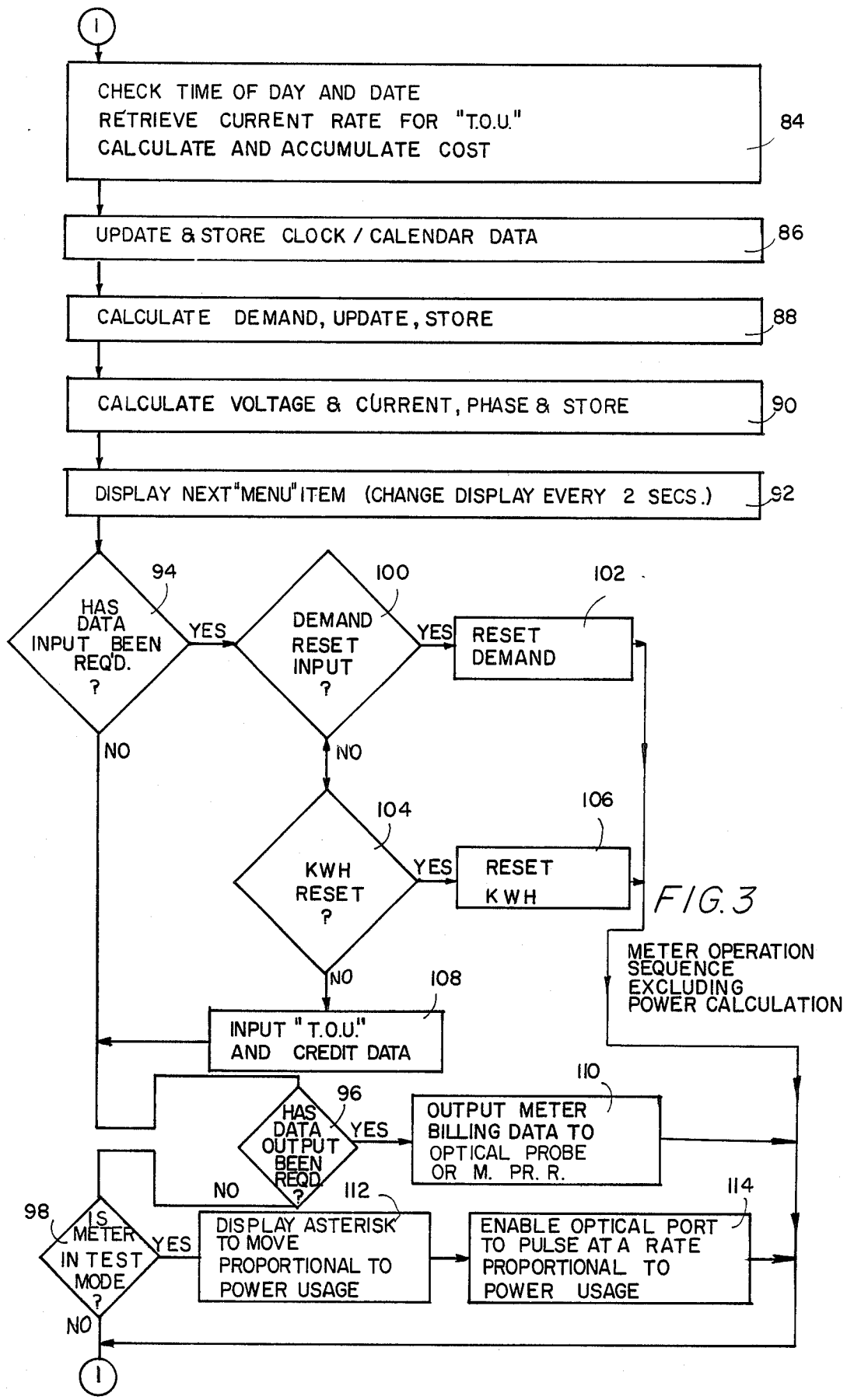
FIG. 3 is a sequence diagram indicating the operations of the intelligent utility meter system, excluding the power calculation.

Now, turning to FIG. 3, the functions of the logic circuitry and the CPU as accomplished by the circuits which will be described in connection with FIGS. 4 and 5 of the drawings, other than the calculation of power, will be considered. Block 84 indicates the steps necessary to update the value or the cost of the power which is being used, and to accumulate the totals. First, the time of use information must be verified, as the facility might be entitled to a lower rate at off peak times, while paying a higher rate during the higher peak times, such as the mid-afternoons when high air conditioning power loads are present. Incidentally, the letters T.O.U. stand for "time of use" and are frequently used with regard to variable rates depending on the time of use. Block 86 indicates the periodic updating and storing of the clock/calendar information, so that the proper "TOU" cost data will be employed in the calculation of the cost of power being used. Each customer has a predetermined maximum "demand" in terms of watts which the facility is entitled to draw at any one time. Block 88 calculates the demand at each interval in time, and stores data when the demand figure is higher than that previously stored relative to the current demand period. The phase angle, or the angle between the voltage and current, is an important factor in some cases, where the voltage may not be precisely in phase with the current. The calculation of the phase angle is indicated by the block 90. Block 92 relates to the display, and the successive display of the power being drawn, the amount of credit or the amount owed the electric company, etc., etc. as listed hereinabove, is the subject of the successive displays which are changed every two seconds, with all of these accurate display activities being indicated by block 92.

Branching points in the cycle are indicated by the diamonds 94, 96 and 98. Block 94 indicates an inquiry as to whether the meter programmer/reader has provided an input signal indicating that new information is to be supplied to the meter unit 16. A "NO" indication leads to diamond 96 to be discussed below. If the answer is yes, an inquiry is then made via block 100 and to whether the maximum permitted "demand" is to be changed. If "yes" then block 102 indicates that the demand indicated within the meter is being reset, while a "no" indicates that we proceed to diamond 104, inquiring as to whether the kilowatt hours are to be reset. A "yes" answer to this inquiry is indicated by the block 106 involving resetting the kilowatt hours recorded or registered in meter 16. If the answer is "no" to the inquiry of diamond 104 then the remaining possibility is the inputting of the time of use and the credit data, as indicated by the block 108.

Diamond 96 inquires "has data output been requested?". A "yes" answer indicates that the optical probe or that the meter programmer/reader has requested that the meter "dump" its contents relating to billing data, and block 110 indicates this function being accomplished. A "NO" answer to the question of diamond 96 leads to diamond 98. The next inquiry is indicated by the diamond 98: "Is meter in the test mode?" A "yes" answer to this inquiry leads to blocks 112 and 114, involving displaying a particular symbol such as an asterisk which will move across the 16 bit alphanumerical display at a speed proportional to power usage; and block 114 which enables the optical port to pulse at a rate proportional to a current power usage. It is current practice to have a dot on the rotating inductive disk within the conventional meter, and the purpose of the functions indicated by block 112 is to provide a similar signal. Also, relative to block 114, the optical probe or the meter programmer/reader may calculate current rate of power usage from the optical pulses received through the window 24. A "NO" answer to the inquiry of diamond 98 leads back to the program input.

Following the actions indicated by blocks 102, 106, and 110, the system reverts to the beginning of the program, as indicated by the encircled "1".

Referring now to FIGS. 4 and 5, the meter unit 16 of FIG. 1 has two principal printed circuit boards, the analog printed circuit board of FIG. 4 and the digital printed circuit board of FIG. 5. From a physical standpoint, the analog board of FIG. 4 is located at reference numeral 122 in FIG. 10 of the drawings, and the analog circuit boards of FIG. 5 at reference numeral 124 and FIG. 10 of the drawing. These printed circuit boards also appear in the showing of FIG. 9 which is a showing of meter unit 16 with the cover removed.

Now, referring back to FIG. 4, this analog board has as its input the two voltages as supplied on leads 132 and 134 shown to the left in FIG. 4, and the two currents which are provided at inputs 136 and 138 at the lower left in FIG. 4. Incidentally, the source of the currents, such as I-1 and I-2 are shown as the transformer 140 in FIG. 11 of the drawings. In FIG. 11 of the drawings, the terminals 142 and 144 represent the power input to one of the two or three circuits which the meter system is designed to measure. Two identical current paths 146 and 148, which are in parallel with one another, extend between the input conductive prongs 142 and 144. The transformer 140 encircles the conductor 146, and therefore measures half of the current supplied on terminals 142 and 144. The output from the transformer 140 is supplied to input 136 or 138 in FIG. 4, and is, of course, representative of the current which flows through terminals 142 and 144. A suitable amplification factor built into the amplifiers 150 and/or 152 accommodates the fact that the transformer 140 is only responsive to exactly 50% of the input current. Of course, depending on the proportion of current being measured, different amplification factors would be used.

At a predetermined instant of time, the sample and hold circuits 154, 156, 158 and 160 sample the input voltages and currents and store the resulting voltage level. The outputs from circuits 154, 156, 158 and 160 are supplied to the multiplexer circuit 162, and the analog output as selected by the multiplexer 162 is routed through terminal 9 of junction connector J1 to the analog-to-digital converter 164 as shown at the lower left-hand side of the circuit of the digital board of FIG. 5.

Returning to the analog of board of FIG. 4, it also includes the power supply transformer 166 which supplies both 15 volt power for the analog board of FIG. 4 at output leads 168 and 170, as well as 5 volts to power the digital board of FIG. 5, at output terminals 172 and 174.

In order to couple digital signals over the power lines between the meter 16 and the remote display unit 26, and the meter programmer reader and vice versa, the circuit 182 and the transformer 184 are provided. The chip 182 is National Semiconductor current carrier transceiver. Digital data from the digital board of FIG. 5 is supplied to the printed circuit board of FIG. 4 on lead 186. The signals are coupled from chip 182 over the transformer 184 to the lines 188 to the power lines 132 and 134. The signal is in the form of frequency shift keying, with the center frequency at approximately 282 kilohertz, and frequency shifting of this signal to convey digital information. As mentioned elsewhere, these high frequency signals are transmitted over the power lines, but are severly attenuated by stepdown transformers such as that shown at reference numeral 62 in FIG. 1. Accordingly, the frequency shift keying digital signals may be transmitted locally on the low voltage power signals, on the customer side of the transformers such as transformer 62, which may encompass several hundred customers. Thus, the electrical utility meter employee may utilize frequency shift keying from the meter programmer reader 42 to electrically couple frequency shift keying signals representing digital information to any of a large number of customers which are on the low voltage side of one of the stepdown transformers 62, from a single plug location.

Turning now to the digital board of FIG. 5, it includes, as mentioned above, the analog-to-digital converter 164 which is in the lower left-hand side of FIG. 5. The CPU 192 is, of course, the key component on the digital board, and controls its operation. Other important circuits which are included on the digital board are the random access memory 194 into which various calculated values are stored and retrieved and the read only memory 196 which includes the stored program determining the successive steps of operation of the entire system. The liquid crystal display 198 is located toward the upper left in FIG. 5 and provides the alphanumeric display which is visible both on the meter unit itself, and also on the remote display unit. The latch circuit 200 holds the digital information for the energization of the display 198. Similarly, latch circuit 202 holds information which is to be transmitted to the analog board, for eventual transmission to the optical probe or through the power lines to the RDU or the meter programmer/reader. Input buffers 204 and 206 store the 12 bit output from the analog-to-digital converter 164, and hold this output for access under the control of the CPU.

In accordance with normal practice in this type of digital system, the parallel connected bus 208 extends through virtually the entire digital circuit, coupled to all of the major units. It utilizes both address signals on one set of parallel leads, and digital signals on another set of parallel leads, and units are intercoupled only when appropriate address signals are sent through the address bus to identify the particular units to which or from which the data is to be coupled. Thus, for example, the address bus included in the bus 208 would identify the latches 204 and 206 and withdraw the stored voltage or current information and then transfer it to a selected address in the RAM 194 upon appropriate command from the CPU 192.

The timing of the digital system of FIG. 5 is controlled by the counters 212 and 214 which reduce the basic frequency of the crystal oscillator 215. The counter circuitry applies a signal to the IRQ input of the CPU 192 to periodically interrupt the ongoing program of the type shown in FIG. 3 of the drawing, to provide regular sampling and calculation of power for each of the two circuits about 16.67 times each cycle of the alternating current, or approximately once each millisecond or thousandths of a second. The priority interrupt decoder 216 enables all of the major circuit components which are coupled to the main bus 208, and thus directs the transfer of information through the digital circuitry.

It is now useful to mention certain aspects of the system which contribute to its simplicity and the economical way in which it accomplishes a relatively complex task. More specifically, the CPU 192 is a simple, reliable 8-bit CPU, and is therefore relatively inexpensive and uncomplicated. In order to obtain sufficient accuracy, the analog-to-digital converter converts the input voltage and current levels to a 12 bit number. In order to multiply two 12 bit numbers to obtain a 24 bit product, using a simple 8-bit CPU, an algorithm is employed which involves the multiplication of "nibbles" or a half-bytes of 4 bits each, and combining the results. This multiplication is necessarily somewhat time consuming and in total, takes approximately half or a little less of the 1,000 microseconds between successive samples. Using a clock period for the computer of approximately one microsecond, the CPU 192 has approximately 1,000 clock periods within which to accomplish both the two power multiplication calculations (one for each of the two circuits handled by the meter), and also to accomplish the other functions, such as display, control, etc., which must be accomplished during each one millisecond sampling interval.

In view of the limited time available, and the necessity for economical use of the time available to the CPU, a special coupling arrangement relative to the analog-to-digital converter 164 was devised. More specifically, at the beginning of each cycle, when a new sample has been taken, a start signal is supplied to the analog-to-digital converter 164. Then, instead of the CPU being idle and waiting for the time period, for example, 13 clock periods, which would be necessary for the analog-to-digital converter to perform its calculation, the CPU immediately starts its multiplication calculation relative to the voltage and current sampled during the prior one millisecond sampling interval. Then, after completing a predetermined portion of this calculation, which is easily divided in half, the CPU returns to the analog-to-digital converter and shifts the output information from the latches 204 and 206 into which it has been stored, into the random access memory 194, from which it will be drawn to be used in the power calculation to be accomplished during the next one millisecond timing interval.

The foregoing mode of operation is shown schematically in the timing chart of FIG. 6. More particularly, the time frame picture in FIG. 6 is 1024 microseconds, or slightly more than one millisecond in length which is approximately equal to 1/16th of a cycle of 60 cycle electrical power. The sampling interval in FIG. 6 is indicated by the pulse 222 which is approximately 208 microseconds in length. The first start pulse from the CPU to the A-D converter is indicated by reference numeral 224. The subsequent time interval in which the A-D converter is performing its calculation is indicated by the square wave form 226. However, as indicated by the square wave form 228, the CPU is, during a time period overlapping with the wave form 226 performing a portion of the voltage times current multiplication, for the preceding time period (T1). Incidentally, the A-D conversion being performed in Block 226 relates to the voltage during the current time interval (T2), while it is again noted that the calculation of the CPU relates to the prior time interval (T1). Then, at the instant indicated by the vertical line 230, the CPU sends a read and transfer signal to the latches 204 and 206 to read out the information calculated by the analog-to-digital converter during interval 226. This readout from the analog-to-digital converter is indicated by the vertical line 232 in the chart of FIG. 6. With this arrangement, the CPU is only involved for a couple of clock periods in starting up the A-D converter, and in reading out the information from the A-D converter latch outputs. This is in contrast to the 13 or perhaps 16 clock pulse intervals which might otherwise have been required for the CPU to start the A-D converter, and wait for it to complete its calculation before removing the output information and transferring it to the random access memory. Incidentally, the wave forms 234, 236, 238, and 240 toward the top of FIG. 6 indicate the outputs from the multiplexer 162 (FIG. 4) as applied to the input of the A-D converter 164. During the block of time indicated by the reference numeral 242, the CPU is performing the general or main program functions, apart from power calculation, as indicated in FIG. 3 of the present drawings. Accordingly, during successive blocks of time, the CPU is performing half multiplications, and then generalized program activities.

Concerning one other minor point relative to FIG. 5, attention is directed to transistor 209 and to the ceramic buzzer 211, which is formed of piezo-electric material. When a customer who has to pre-pay his utility bill reaches a predetermined low credit level, so that the utility will soon be shut off, buzzer 211 will be periodically activated to provide an audible warning signal. This may for example be in the form of a short rapid series of audible pulses, repeated every one-half hour. The buzzer 211 may be included in both the meter unit 16 and the RDU 26, or only in the RDU, as desired. In addition, as mentioned elsewhere herein, the displays may be flashed as a supplemental warning.

Referring now to FIGS. 7 through 11 of the drawings, these all relate to the meter 16 per se. FIG. 7 is a top view of the meter showing the outer housing 16, with the upper larger window 22 being provided so that the LCD display 198 may clearly be seen. Reference numeral 24 identifies the lower smaller window through which the optical probe may be coupled to a light emitting diode 252 and a phototransistor 254, which are mounted on the upper (digital) circuit board 124, as shown in FIG. 9 of the drawings. These same components, bearing the same reference numerals, may be seen in FIG. 5, toward the left center of the circuit diagram.

Incidentally, as mentioned hereinabove, FIG. 9 is a top view of the meter taken from the same point of view as FIG. 7, but with the outer cover of the unit removed. In FIG. 9, the upper printed circuit board 124 is partially cut away to reveal the lower printed circuit board 122, which is of course the analog board of which the circuit is shown in FIG. 4 of the drawings. It is located in the inner position, closer to the input voltage and the current as sensed by transformer 140, and as shown in FIG. 11 of the drawings.

Incidentally, the cross-sectional view of FIG. 10 is taken along lines X—X of FIG. 9, while FIG. 11 is a partial cross-sectional view taken along lines XI—XI of FIG. 10. In FIG. 10, the reference numeral 16, which has generally been employed to indicate the entire meter unit, extends to the outer cover, which is present in FIG. 7, but which has been removed for the purposes of FIG. 9. The base of the meter unit is conventional and is designed to be inserted directly into standard meter sockets used by electrical utility companies. The conventional utility meter base including the two conductive prongs 142 and 144 discussed hereinabove, for one electrical circuit, and the two additional conductive prongs 256 and 258 for a second electrical circuit, as clearly shown in the bottom view of FIG. 8. The transparent plastic sheet material 260 shown in FIG. 10 extends entirely across the opening 22 through which the LCD display 198 is visible, and also extends across the second opening 24 through which a coupling is made to the phototransistor 254 and the light emitting diode 252.

The cover for the meter 16 may be nickel-coated steel, thus providing protection against electrical or magnetic interference with the meter electronics. In addition, the reflective nickel coating has a good appearance, and its reflective qualities preclude undue heat build-up from exposure to the sun, for example.

In FIG. 10, the plug and socket combination 153 may also be noted. Connections from the transformer 140, and other electrical input from the base may be supplied to printed circuit board 122 through this plug and socket, thus permitting the standardization of the base units and the use of slightly modified boards 122 to accommodate one, two or three electrical circuit measurement, or other variations needed for coupling to different system units.

Turning now to the remote display unit 26, as shown in FIG. 1 of the drawings, the electronics included in this unit are substantially the same as those shown in FIGS. 4 and 5 for the meter 16, with certain exceptions to be discussed at this point. More specifically, with reference to FIG. 4, the lower portion of this figure relating to the sampling of the voltage and current, is completely eliminated. Similarly, the three units shown at the lower left in FIG. 5, i.e., the analog to digital converter 164 and the two input buffers 204 and 206 are not included in the remote display unit 26. However, the RDU 26 does include the switch 38 shown at the bottom and slightly left of the center of FIG. 5 which switch is not included in the digital board in the meter 16. When this switch 38 is depressed, as mentioned hereinabove, the display on the liquid crystal display 28 is held, so that the customer or occupant of the facility may record the displayed information. This permits the customer to make careful notations relating to cost of use of electricity at different times of the day, and to determine his billing status at any time, for example.

FIG. 12 shows an alternative packaging arrangement for the meter for measuring power coming into the facility. The meter box 257, of FIG. 12 may be made of metal and is intended for mounting on a power pole or underground. It has no visible display, and is intended primarily for use with an associated R.D.U., or Remote Display Unit, mounted within the premises. The three input conductors 259 bring the three phase circuit to the meter box 257 and the three output wires are designated by reference numeral 261. Shrink wrap plastic members 263 are slid back over the two sets of insulated conductors 259 and 261 prior to their connection to the meter box 257. The shrink wrap plastic members 263 are then pulled up over the two ends of meter box 257, and heat from a powerful source of heat, such as a blow torch, is applied to the shrink wrap plastic, in accordance with known techniques to seal the plastic members 263 to the leads 259 and 261, as well as to the meter box 257. The meter box 257 contains substantially the same printed circuit boards and circuitry as discussed above in connection with the meter 16.

The simplified circuit of FIG. 13 is also included within the remote display unit of 26, but not in the meter 16. More specifically, it may be recalled that the RDU 26 includes a slot 34 through which the credit card 36 may be slid, (see FIG. 1) in order to make a payment to the electrical utility company. In FIG. 13, the magnetic reading head 268 couples electrical signals picked up by the action of the magnetic stripe on the credit card as it is moved past the reading head 268, and couples these electrical signals to the magnetic card reader 270. This magnetic card reader 270 picks up the signals which are provided from reading head 268, which signals may incidentally be of varying amplitude and frequency depending on how the magnetic card is moved through the slot, and it transmits normalized output digital signals over lead 272 to the electrical connector 274 which in turn couples them to the circuit boards on the remote display unit 26 for processing and eventual crediting of predetermined sums to the customer's account.

Figures 14, 15:
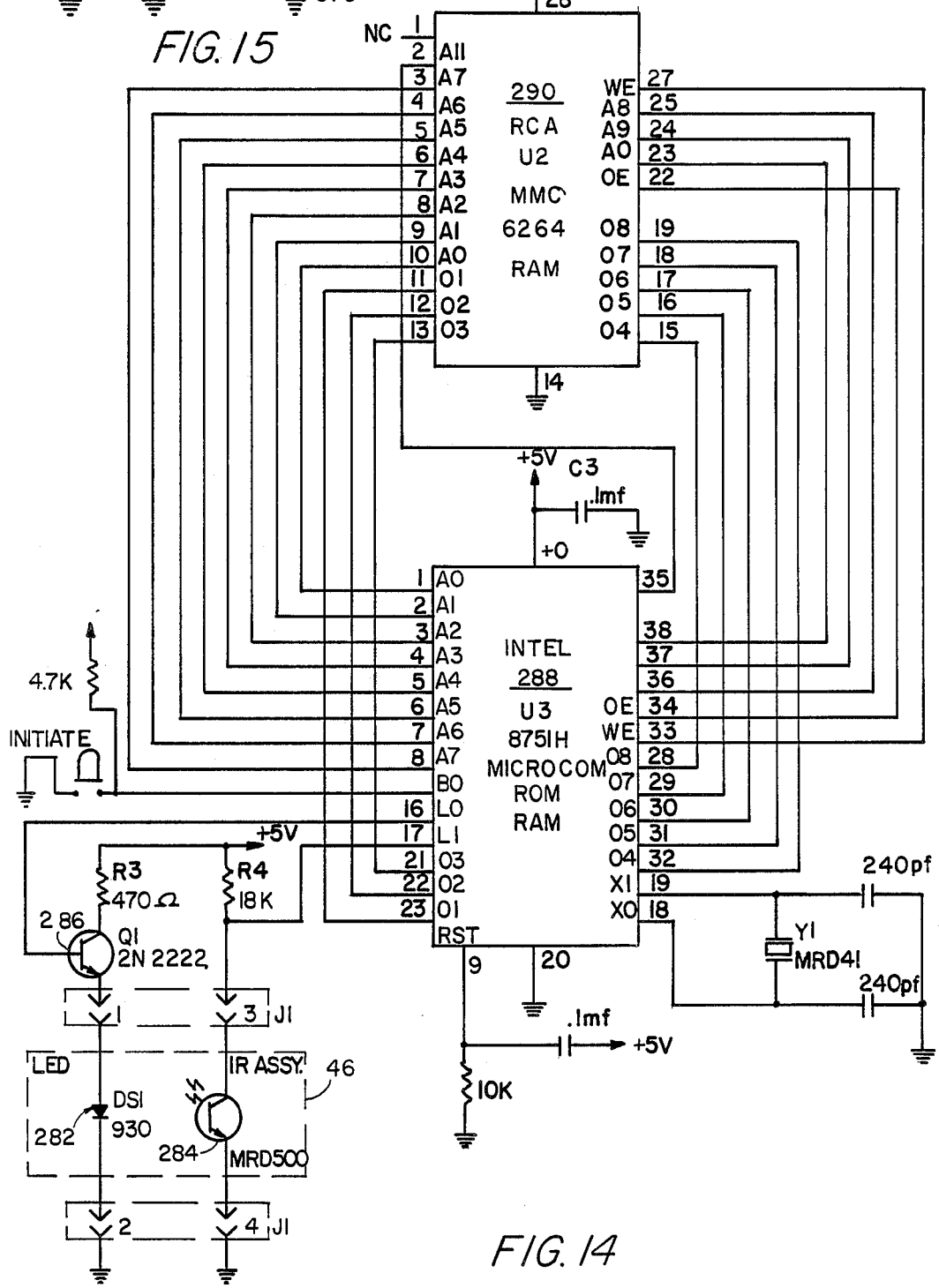
FIG. 14 is a block circuit diagram for an optical meter probe shown in FIG. 1 of the drawings.
FIG. 15 shows the power supply circuit for the optical probe.

FIGS. 14 and 15 show the electrical circuitry which is included within the optical probe 44 as shown in FIG. 1 of the drawings. More specifically, the unit includes the light emitting diode 282 and the phototransistor 284 which are located adjacent the tip 46 of the optical probe 44, so that, when this tip 46 is mated with the opening 24, the light emitting diode 282 is in coupling proximity with the phototransistor 254 as shown in FIGS. 5 and 9 of the drawings, and the phototransistor 284 of the optical probe is in coupling proximity with the light emitting diode 252 of the meter unit 16. Incidentally, the dashed lines 46 in FIG. 14 represent schematically the tip 46 of the optical probe, as shown in FIG. 1 of the drawings. The transistor 286 is a driver transistor which supplies power at the proper levels to the light emitting diode 282, under control of signals from the microcomputer chip 288. It may also be noted that the chip 288 may be a microcomputer including both a read only memory (ROM) and random access memory (RAM) and may be of a type manufactured by Intel under the indicated chip number. Chip 290 is a random access memory, providing additional storage capacity for the optical probe, and it is operated under the control of the microcomputer included in chip 288. With the additional random access memory 290, the optical probe may store billing data for more customers than may be visited by a meter reader in the course of a normal work day. Accordingly, the meter reader turns in one optical reader at the end of the day or the beginning of the next following day and picks up another one, and while the meter reader is obtaining a second set of meter readings from a new group of homes, the optical probe employed during the previous day is having its contents read by the utility system company's billing computer. The optical probe 44 is powered by a small nine volt battery 292 as shown in the small separate diagram of FIG. 15, and the chip 294 together with the indicated associated circuitry converts the nine volts to the five volt power supply needed for operation of the circuitry in FIG. 13.

The meter programmer/reader 42 may be coupled to the meter 16 either through frequency shift keying signals operative over the power lines, as discussed above in connection with circuit components 182, 184 and 186 in the upper left hand corner of FIG. 4, or the meter programmer/reader may be coupled to the meter reader through the optical probe 44, as indicated by the electrical cable 56, as shown in FIG. 1. The meter programmer/reader may be provided with circuit boards as shown in FIGS. 4 and 5 to give it the full capability of the meter 16. In addition, it has the capability of supplying coded digital signals to the meter 16 to reset the data stored in the random access memory of the utility meter. Thus, for example, when a meter is being installed in a new location, and it is desired to reset the meter to zero, this instruction may be programmed into the meter reader and these instructions may be supplied to the electrical utility meter either through the optical probe or by way of frequency shift keying through the power lines.

Now, referring back to FIG. 1, also shown in FIG. 1 is the gas meter 57, a power line carrier signal generator 59 and power circuit 61. Signals indicating gas utilization are supplied from meter 57 to the power line signal generator 59, which includes circuitry comparable to that of FIG. 4 including components 182, 184 and 186. The power line carrier generator circuit 59 periodically sends coded signals to meter 16 indicating gas consumption, and this information is stored and processed in meter 16. The display at meter 16 and the RDU inside the facility may include billing and usage data on the gas utility, and/or the water or other utilities used by the facility.

Set forth in Table No. I is a representation of typical displays which may appear successively in the sixteen bit, dot matrix, liquid crystal display, which may be included both in meter 16 and also in the remote display unit 26. Note particularly that other utility information involving gas and water, for example, may be displayed. In Table I, the sixteen digit display appears to the left, and the explanation for the display appears to the right.

upon command by the MPR, this data may be displayed as a series of hourly readings on the LCD display.

For completeness, reference is made to U.S. Pat. No. 4,240,030, granted Dec. 16, 1980, and entitled "Intelligent Electric Utility Meter." While the circuitry of U.S. Pat. No, 4,240,030 was a significant advance as compared with prior types of electrical utility meters, it did not include a number of the features which are included in the present system. Thus, for example, the prior patent did not disclose the remote display unit, the optical probe, or the meter programmer/reader. Similarly, no time of use data was included in the prior system, with variable rates for different times, nor was the power sensed many times per cycle, as in the present case. In connection with the power sensing arrangements, the earlier patent cited above used a conventional rotating inductive disc with an eddy current drive proportional to steady power drawn. Incidentally, it is noted that these prior types of power measuring arrangements were insensitive to certain types of power pulses, so that power drawn in pulses might not be fully measured, accounted for, and charged to the customer. It is also noted that there have been many other proposed electronic electric utility meters. However, as noted above, these have all been either very expensive, or not fully compatible with existing meter systems. By a unique

TABLE I

| | |
|---|---|
| DEMAND 15756 KW | DEMAND ACCUMULATION |
| #006574325627065 | METER # |
| 01/01/86 22:55 | DATE - TIME |
| 0627 KILOWATTS | CURRENT (PRESENT) LOAD IS 627 WATTS |
| 627 KWH THIS MO. | CUMULATIVE KWH THIS MONTH |
| *DEMAND 15756 KW | SHOWS ANOMALY* (THEFT) INTRUSION, ETC. |
| 0800 .035 | WINDOW - TOU SHOULDER |
| 1100 .060 | WINDOW - TOU PEAK |
| 1400 .052 | WINDOW - TOU SHOULDER |
| 1900 .030 | WINDOW - TOU PEAK |
| CREDIT $20.53 | REMAINING CREDIT |
| CREDIT −$20.53 | CUSTOMER OWES UTILITY |
| WAIT | CARD JUST READ - BEING LOADED |
| PHASE ANGLE 05 | LEADING PHASE ANGLE |
| PHASE ANGLE −06 | LAGGING PHASE ANGLE |
| WARNING LOW $$$ | BLINKING/AUDIBLE |
| GAS $26.50 THIS MO | |
| WATER 14.50 QTR | GAS AND WATER UTILITY INFORMATION |
| GAS 4765 CU. FT. | |
| WATER 2765 GAL | |

Concerning certain matters set forth in Table I, and mentioned elsewhere in the present specification, a more complete explanation is in order. Thus, on the Time of Use or "TOU" displays, the highest rate is during the peak air conditioning and other electrical usage hours, the intermediate or "shoulder" periods are also specified, as is the off-peak late night hours. Concerning the term "therms" this measure is a unit of heat employed to measure utility power delivered, when heat is delivered in the form of steam or the like, rather than as gas to be burned by the user, for example. Concerning the term "Co-Generation" this involves situations where the utility customer may have a wind-powered electricity generator. When the customer is supplying power back to the utility company net, a negative sign would appear in the display relative to the present electrical utility load. With regard to the load profile, in some cases it is useful for the utility company to obtain data on hourly consumption of representative customers. This information may be stored in the random access memory of the meter, and may be read out by the meter programmer reader unit; or, alternatively, combination of inexpensive, reliable and efficient components, the present electric utility meter system is not only capable of full installation without the need for new wiring, but also provides both the customer and the utility company with much greater flexibility and capabilities than have ever been available heretofore. In addition, all this is accomplished at a very low cost through the use of electronic chips having proven reliability and simplicity.

In conclusion, it is to be understood that the system as described hereinabove and as shown in the drawings is illustrative of the principles of the present invention. However, various changes and modifications may be made without departing from the spirit and scope of the invention. Thus, other logic circuits could be employed in place of the precise ones shown in the logic circuit diagram, and VLSI circuitry may be employed in their implementation. Similarly, the indicated steps and operations could be shifted, as long as the overall accomplishments are as indicated hereinabove. In addition to the use of a meter reader having an optical probe, or a meter programmer/reader, the meter could transmit information over a radio link, a fiber optic or coaxial cable, or over the telephone lines, back to the utility system main office. Accordingly, the present invention is not limited to the system precisely as shown and described hereinabove.

What is claimed is:

1. An intelligent electrical utility meter system installation comprising:
   means for sampling current and voltage and for calculating power consumption at least 600 times per second;
   alphanumeric display means for succesively displaying utility information; and
   means including circuitry connected to said sampling means for supplying to said display means for successive display, the following information:
   (a) the meter identification or serial number;
   (b) the data and time;
   (c) the present power being used;
   (d) cumulative kilowatt hours;
   (e) current billing status; and
   (f) the time of use hours for reduced power costs.

2. An intelligent utility meter installation as defined in claim 1 further including means for successively changing the alphanumeric display means to successively display the different quantities as recited in claim 1.

3. An intelligent utility meter system installation as defined in claim 1 wherein said meter unit is provided with a metallic cover means having a reflective outer surface to provide electrical shielding and to reduce ambient temperature excursions.

4. An intelligent utility meter as defined in claim 1 including means for coupling another non-electric utility meter to said electrical utility meter system to transmit usage information from the non-electric utility meter to said electric utility meter system, and including means for displaying utilization information relative to said other utility on said alphanumeric display means.

5. An intelligent utility meter as defined in claim 1 including means for displaying the power phase angle.

6. An intelligent utility meter as defined in claim 1 including means for displaying a flashing warning and, for actuating an audible warning signal when a customer's credit is substantially exhausted.

7. An intelligent utility meter system installation for measuring A.C. electric energy having repetitive A.C. cycles, comprising:
   (1) an "outside" principal meter unit including:
      (a) means for sampling current and voltage and for calculating power consumption at least 300 times per second; said sampling occurring asynchronously and not in any fixed timed relationship with respect to the A.C. electricity cycles;
      (b) said outside unit further including means for determining the total kilowatt hours used, and the present billing status; and
      (c) alphanumeric display means for displaying power being used, total kilowatt hours and present billing status;
   (2) a remote "inside" unit including:
      (a) alphanumeric means for displaying the information displayed by said "outside" unit;
      (b) means for selectively retaining a desired continuously updated display; and
      (c) means for reading a credit card and automatically changing the billing status information within the intelligent utility meter as credit card information is read; and
   (3) said system including means for determining both the magnitude and direction of the electric power passing through said meter system.

8. An intelligent utility meter installation as defined in claim 7 further including means for displaying varying time of use rates both on the "outside" and "inside" units.

9. An intelligent utility meter installation as defined in claim 7 wherein said "outside" principal meter unit includes base connector means for mating with standard utility meter sockets, and wherein said remote "inside" unit includes power plug means for coupling to the electrical power of customer facilities; and means for transmitting information between the two units over the power circuits; whereby installation costs are minimized.

10. An intelligent utility meter system installation as defined in claim 7 further including means for coupling one or more additional utility meters for non-electric utilities to said principal meter unit, and means for displaying said additional utility meter information on said alphanumeric display means.

11. An intelligent utility meter system as defined in claim 7 further comprising a meter programmer reader, and means for coupling said meter programmer reader to said principal meter unit through the electrical power lines of a facility to which electricity is being provided and with which the principal meter unit is associated.

12. An intelligent utility meter installation as defined in claim 7 further including means for successively changing the alphanumeric display means to successively display the different quantities as recited in claim 7.

* * * * *